United States Patent
Jin et al.

(10) Patent No.: US 9,526,166 B2
(45) Date of Patent: Dec. 20, 2016

(54) BEZEL STRUCTURE FOR A DISPLAY DEVICE AND DISPLAY DEVICE HAVING THE SAME

(71) Applicant: SAMSUNG DISPLAY CO., LTD., Yongin, Gyeonggi-Do (KR)

(72) Inventors: Kyong-Bin Jin, Suwon-si (KR); Kyoung-Woo Park, Daejeon (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 29 days.

(21) Appl. No.: 14/336,619

(22) Filed: Jul. 21, 2014

(65) Prior Publication Data
US 2015/0062841 A1  Mar. 5, 2015

(30) Foreign Application Priority Data
Aug. 30, 2013  (KR) .......... 10-2013-0103998

(51) Int. Cl.
| | |
|---|---|
| H05K 1/00 | (2006.01) |
| H05K 1/02 | (2006.01) |
| G06F 1/16 | (2006.01) |
| H04M 1/02 | (2006.01) |
| H05K 1/18 | (2006.01) |

(52) U.S. Cl.
CPC ............. *H05K 1/028* (2013.01); *G06F 1/1613* (2013.01); *H04M 1/0266* (2013.01); *H04M 1/0283* (2013.01); *B32B 2457/202* (2013.01); *H05K 1/189* (2013.01); *H05K 2201/10128* (2013.01); *Y10T 428/24884* (2015.01); *Y10T 428/31786* (2015.04)

(58) Field of Classification Search
None
See application file for complete search history.

(56) References Cited

U.S. PATENT DOCUMENTS

| | | | |
|---|---|---|---|
| 2002/0062761 A1* | 5/2002 | Odaka ............... | 106/31.29 |
| 2009/0280305 A1* | 11/2009 | Ishikawa ............. | B41M 1/10 |
| | | | 428/201 |
| 2010/0129568 A1* | 5/2010 | Kim ................... | C09J 133/14 |
| | | | 428/1.54 |
| 2013/0000822 A1 | 1/2013 | Kim et al. | |
| 2013/0044282 A1* | 2/2013 | Kuwabara et al. ........ | 349/96 |
| 2013/0057497 A1* | 3/2013 | Cho ................... | G06F 3/044 |
| | | | 345/173 |

FOREIGN PATENT DOCUMENTS

| | | |
|---|---|---|
| KR | 10-2012-0139407 A | 12/2012 |
| KR | 10-2013-0007068 A | 1/2013 |
| KR | 10-2013-0034272 A | 4/2013 |

* cited by examiner

*Primary Examiner* — Ellen S Wood
*Assistant Examiner* — Anthony J Frost
(74) *Attorney, Agent, or Firm* — Lee & Morse, P.C.

(57) ABSTRACT

A bezel structure for a display device includes a first resin layer capable of being cured by ultraviolet radiation, an ink layer including a non-volatile solvent disposed on the first resin layer, a second resin layer disposed in the ink layer, and an upper structure disposed on the ink layer. The second resin layer prevents an uncured portion of the first resin layer from permeating into a cavity in the ink layer.

19 Claims, 5 Drawing Sheets

BEZEL STRUCTURE FOR A DISPLAY DEVICE AND DISPLAY DEVICE HAVING THE SAME

CROSS-REFERENCE TO RELATED APPLICATION

The present application claims priority under 35 U.S.C. §119 to Korean Patent Application No. 10-2013-0103998, filed on Aug. 30, 2013, in the Korean Intellectual Property Office, and entitled: "Bezel Structure For A Display Device and Display Device Having The Same," which is incorporated by reference herein in its entirety.

BACKGROUND

1. Field

Example embodiments relate to a display device. More particularly, example embodiments relate to a bezel structure for a display device and a display device having the bezel structure.

2. Description of the Related Art

In general, a display device such as a television, a tablet, a personal computer, a mobile phone, etc includes a display area that displays images and a bezel that surrounds the display area. The bezel includes a flexible printed circuit board (FPCB) and internal circuits that transfer electrical signals. Additionally, the bezel provides a design effect on the display device by implementing various colors based on a bezel structure that includes an ink layer, so that an aesthetic effect of the display device may be improved.

SUMMARY

Example embodiments provide a display device having a bezel structure.

A bezel structure for a display device is provided including a first resin layer curable by ultraviolet radiation, an ink layer including a non-volatile solvent on the first resin layer, a second resin layer in the ink layer, the second resin layer preventing an uncured portion of the first resin layer from permeating into a cavity in the ink layer, and an upper structure on the ink layer.

The second resin layer may include a transparent polymer resin.

The upper structure may include a polyethylene-terephthalate (PET) film and a protection window on the PET film. The upper structure may further include a pattern layer on the PET film, and the pattern layer may include a pattern that is patterned by an ultraviolet molding process with a polymer resin. The upper structure may further include an oxide layer on the pattern layer, and the oxide layer may include a plurality of oxides that have respective refractive indexes.

The PET film and the protection window may be bonded by an optically clear adhesive (OCA), and the protection window may include a glass window.

A bezel structure for a display device is also provided that may include a first resin layer curable by ultraviolet radiation, an ink layer including a non-volatile solvent over the first resin layer, a second resin layer between the first resin layer and the ink layer, the second resin layer preventing an uncured portion of the first resin layer from permeating into a cavity in the ink layer, and an upper structure on the ink layer.

A display device is also provided that may include a display panel, a functional panel on the display panel, a flexible printed circuit board (FPCB) in electrical communication with the display panel and the functional panel, and a bezel structure including a transparent resin layer and an ink layer for preventing discoloration of the bezel.

The functional panel may include at least one of a protection film, a polarizing plate, and a touch screen panel.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
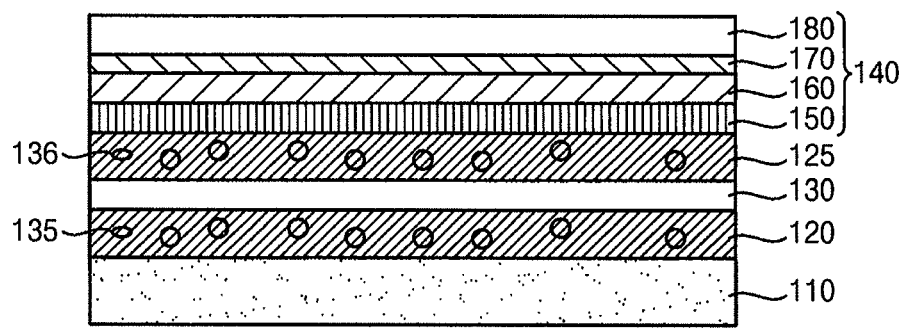
FIG. 1 illustrates a cross-sectional view of a bezel structure for a display device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that when an element or layer is referred to as being "on," another element or layer, it can be directly on, connected or coupled to the other element or layer or intervening elements or layers may be present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower," than other elements or features would then be oriented in an upper position relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to be limiting in scope.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view of a bezel structure for a display device according to example embodiments.

Referring to FIG. 1, the bezel structure 100 may include a first resin layer 110, an ink layer 120 and 125, a second resin layer 130, and an upper structure 140. The upper structure 140 may include a polyethylene-terephthalate film (i.e., PET film) 150 and a protection window 180. In some example embodiments, the upper structure 140 may further include a pattern layer 160 and an oxide layer 170.

The first resin layer (e.g., an ultraviolet curable resin layer) 110 may be formed on a lower panel to bond the lower panel to a protection window. Further, the first resin layer may increase brightness, transitivity, reflectivity, and visibility of the display device. A bezel may be formed on portions of the first resin layer 110 (e.g., surrounding a display area of the display device).

The first resin layer 110 may include an optical bonding resin to act as a bonding layer. In other words, the first resin layer 110 may have an adhesive property when the first resin layer 110 is exposed to ultraviolet radiation. The first resin layer 110 may be formed by a reaction of a photoinitiator and a monomer (or, an oligomer). The photoinitiator may generate a radical when the photoinitiator is exposed to the ultraviolet radiation. A polymer having an adhesive property may be formed by a polymerization reaction of the radical with the monomer. Therefore, to form the first resin layer 110 that has good adhesive properties, the first resin layer (i.e., the optical bonding resin) may be exposed to a sufficient amount of ultraviolet radiation. However, a shadow area of the first resin layer 110 may have an uncured portion (i.e., an uncured resin) that is insufficiently exposed to ultraviolet radiation. In other words, the uncured portion of the first resin 110 may mainly occur in the bezel. Monomers which are not polymerized may still remain in the uncured portion.

The ink layer 120 and 125 may determine a color of the bezel. The ink layer 120 and 125 may include non-volatile solvent. The ink layer 120 and 125 may be formed on the ultraviolet curable resin layer 110. The ink layer 120 and 125 may include the non-volatile solvent, a resin, and a pigment. In a drying process after forming the ink layer 120 and 125, if the ink layer 120 and 125 includes volatile solvent, a number of cavities 135 and 136 may be generated in the ink layer 120 and 125 by evaporation of the volatile solvent. Thus, in example embodiments, the ink layer 120 and 125 may include the non-volatile solvent. The non-volatile solvent may be hard to evaporate in the drying process, so that the cavity 135 and 136 (or, cavities) generated in the ink layer 120 and 125 may be reduced (or, minimized). The non-volatile solvent may include cyclohexanon, isophorone (IPR), etc.; however, the non-volatile solvents are not limited thereto. The pigment in the ink layer 120 and 125 may determine a color of the overall bezel structure 100. For example, the pigment may include carbon black, titanium oxide ($TiO_2$), zinc oxide (ZnO), lithopone, lead white, etc. The carbon black may be used to represent a black color bezel structure 100. Titanium oxide ($TiO_2$), zinc oxide (ZnO), lithopone, and lead white may be used to represent a white color bezel structure 100. Since these are examples, the pigments are not limited thereto. Various pigments representing various colors may be included in the ink layer 120 and 125.

The cavity 135 and 136 may be generated in the ink layer 120 and 125 by evaporation of solvent or gas that is generated in chemical reactions. Monomers in the uncured portions of the first resin layer 110 may permeate into the cavity 135 and 136, so that the bezel may be discolored. Thus, the monomers may be prevented from permeating into the cavities 135 and 136 to prevent discoloration of the bezel. The second resin layer 130 may prevent the monomer from permeating into the cavity 136.

The second resin layer 130 may be disposed in the ink layer 120 and 125 to prevent the monomers (i.e., the uncured ultraviolet curable resin) from permeating into the cavity 136 that is generated in the ink layer 125. In example embodiments, the second resin layer 130 may include a transparent polymer resin. For example, the transparent polymer resin may include acrylic urethane, epoxy, polyester, etc. Since these are examples, the transparent polymer resins are not limited thereto.

The second resin layer 130 may act as a barrier that prevents the monomer from moving through the second resin layer 130. As illustrated in FIG. 1, the monomers may not be able to permeate into the cavity 136 in the ink layer 125 that is formed on the second resin layer 130. Therefore, the second resin layer 130 may prevent discoloration of the bezel.

The upper structure 140 may be disposed on the ink layer 125. In example embodiments, the upper structure 140 may include the PET film 150 and a protection window that is formed on the PET film 150. The PET film 150 may have a high strength, good heat-resisting properties, good electric insulation, good chemical durability, and low air permeability. Therefore, reliability of the bezel structure 100 and the display device may be improved.

In example embodiments, the upper structure 140 may further include a pattern layer 160 that is disposed on the PET film 150, and the pattern layer 160 may include a pattern that is patterned by an ultraviolet (UV) molding process with a polymer resin. A pattern of the pattern layer 160 may include a grid-like pattern, a wave pattern, etc. Thus, the pattern layer 160 may provide an improved esthetic effect to the bezel by adding some patterns to the colored bezel. However, the patterns of the pattern layer 160 are not limited thereto. The pattern layer 160 may have various patterns.

In example embodiments, the upper structure 140 may include an oxide layer 170 that is disposed on the pattern layer 160, and the oxide layer 170 may include a plurality of oxides that have respective refractive indexes. The oxide layer 170 may include materials (or, oxides) having a low refractive index and materials (or, oxides) having a high refractive index. The low refractive index material (or, oxide) and the high refractive index material (or, oxide) may be alternately laminated to form the oxide layer 170. A light may be irregularly reflected in the oxide layer 170 due to a difference of the refractive indexes, so that the bezel may have glittering effect. Thus, the oxide layer 170 may provide an aesthetic effect to users. The high refractive index material may include titanium oxide ($TiO_2$). The low refractive index material may include silica ($SiO_2$). For example, when a wavelength corresponds to about 630 nm, which belongs to a visible light region, the refractive index of titanium oxide may be about 2.49, and the refractive index of silica may be about 1.46. Oxides included in the oxide layer 170 are not limited thereto. The oxide layer 170 may include a plurality of oxides having different refractive indexes. The difference between the refractive indexes may be up to a certain level.

The protection window 180 may be disposed on the PET film 150. The protection window 180 may be formed on top of the bezel structure 100. Thus, the protection window 180 may protect a lower structure from external shock, moisture transmission, etc. In example embodiments, the PET film 150 and the protection window 180 may be bonded together by an optically clear adhesive (OCA). Thus, the bezel structure may be transparent. Further, in example embodiments, the protection window 180 may be a glass window. In example embodiments, the protection window 180 may be a plastic window.

As described above, the bezel structure 100 for a display device may minimize the generation of cavities in a drying process of the ink layer 120 and 125 when non-volatile solvents are used to form the ink layers 120 and 125. In addition, the bezel structure 100 may prevent the monomers from permeating into the cavity 136 of the ink layer 125 when the second resin layer 130 (i.e., the transparent resin layer) is between the ink layers 120 and 125. Therefore, discoloration of the bezel may be reduced, prevented, or substantially prevented.

FIGS. 2A through 2F illustrate cross-sectional views illustrating a process of forming the bezel structure of FIG. 1.

Figure 2A:
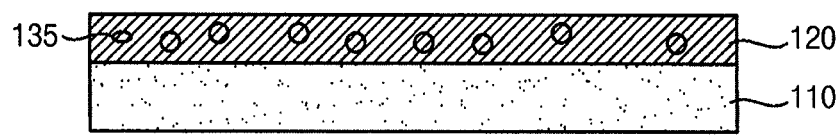
FIGS. 2A through 2F illustrate cross-sectional views for describing a process of forming the bezel structure of FIG. 1.

Referring to FIG. 2A, an ink layer 120 that may determine a color of the bezel may be formed on a first resin layer 110. The first resin layer 110 may be cured by ultraviolet radiation. In a display device, the first resin layer 110 may be formed on an overall lower panel to bond the lower panel to a protection window.

The first resin layer 110 may have adhesive properties when the first resin layer 110 is exposed to ultraviolet radiation. The first resin layer 110 may be formed by a reaction of a photoinitiator and a monomer (or, an oligomer). Because forming the first resin layer 110 is described above, duplicated descriptions will not be repeated.

A shadow area of the first resin layer 110 may have an uncured portion (i.e., an uncured resin) that is insufficiently exposed to ultraviolet radiation. Monomers that are not polymerized may still remain in the uncured portion. Further, the monomers may freely move into an ink layer 120. In particular, the monomers may permeate a cavity 135 (or, cavities) that are formed in the ink layer 120, so that the bezel may become discolored.

The ink layers 120 and 125 may determine a color of the bezel. The ink layers 120 and 125 may include a non-volatile solvent. The ink layers 120 and 125 may be formed on the ultraviolet curable resin layer 110. The ink layers 120 and 125 may include the non-volatile solvent, a resin, and a pigment. The non-volatile solvent may be hard to evaporate in a drying process, so that the cavity 135 and 136 (or, cavities) generated in the ink layers 120 and 125 may be reduced (or, be minimized).

Figure 2B:
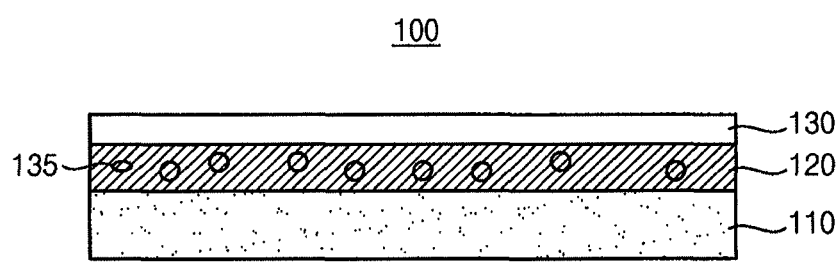
Figure 2C:
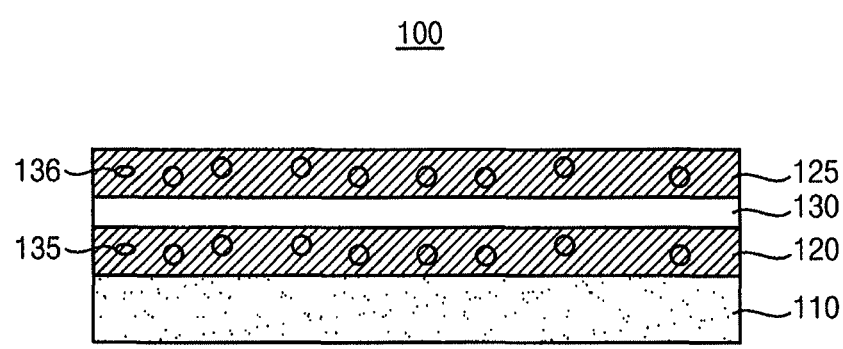

Referring to FIG. 2B and FIG. 2C, a second resin layer 130 may be formed on the ink layer 120, and then an ink layer 125 may be formed on the second resin layer 130. The second resin layer 130 may act as a barrier that prevents monomers from moving over the second resin layer 130. Thus, the monomers may not permeate or substantially permeate into the cavity 136 in the ink layer 125 that is formed on the second resin layer 130.

When the monomer permeates into the cavity 136, the ink layer 120 may have discolored portions. However, the discolored portions may not appear on the outside because the ink layer 125 disposed on the second resin layer 130 covers the discolored portions. Therefore, the second layer 130 disposed between the ink layer 120 and the ink layer 125 may prevent the discoloration of the bezel.

In example embodiments, the second resin layer 130 may include a transparent polymer resin. Since the second resin layer 130 is described above, duplicated description will not be repeated.

Figure 2D:
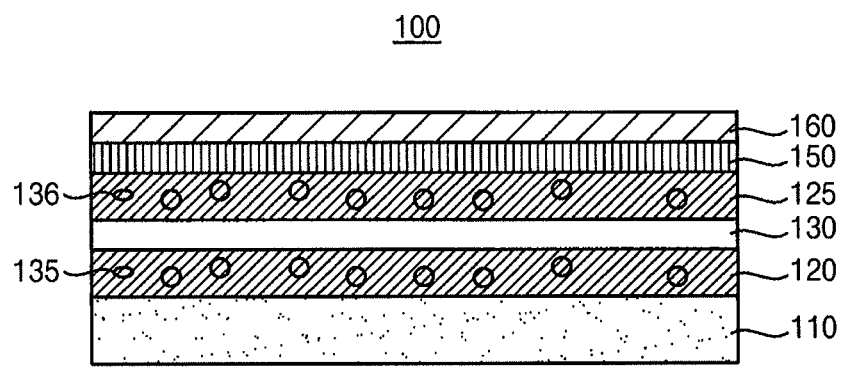

Referring to FIG. 2D, a PET film 150 having a pattern layer 160 may be formed on the ink layer 125.

The pattern layer 160 may be formed by a molding process. The process may include an operation of depositing an ultraviolet curable resin on the PET film 150, an operation of patterning the ultraviolet curable resin using a transparent tool (or a mold) that has a certain pattern, and an operation of exposing the ultraviolet curable resin to ultraviolet radiation.

A pattern of the pattern layer 160 may include a grid-like pattern, a wave pattern, etc. Thus, the pattern layer 160 may provide an improved esthetic effect to the bezel by adding some patterns to the colored bezel. However, the patterns of the pattern layer 160 are not limited thereto.

Figure 2E:
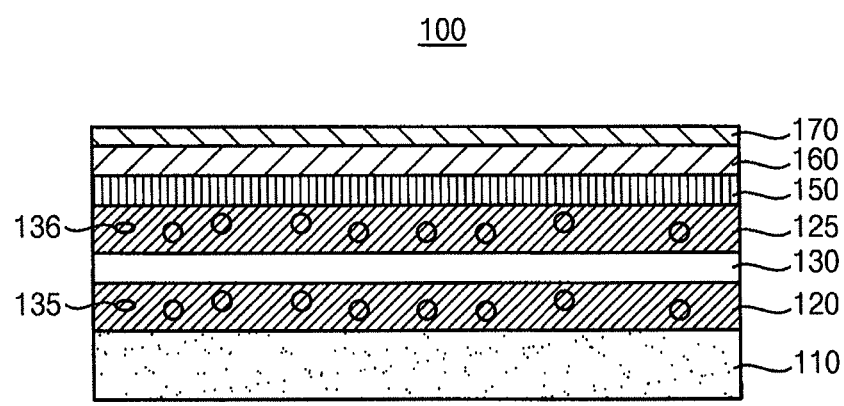

Referring to FIG. 2E, an oxide layer 170 may be formed on the PET film 150 including the pattern layer 160. The oxide layer 170 including a plurality of oxides that have respective refractive indexes. The oxide layer 170 may include materials (or, oxides) having low refractive index and materials (or, oxides) having high refractive index. The low refractive index material (or, oxide) and the high refractive index material (or, oxide) may be alternately laminated to form the oxide layer 170. A light may be irregularly reflected in the oxide layer 170 due to a difference of the refractive indexes, so that the bezel may have glittering effect. Thus, the oxide layer 170 may provide an aesthetic effect to users.

Figure 2F:
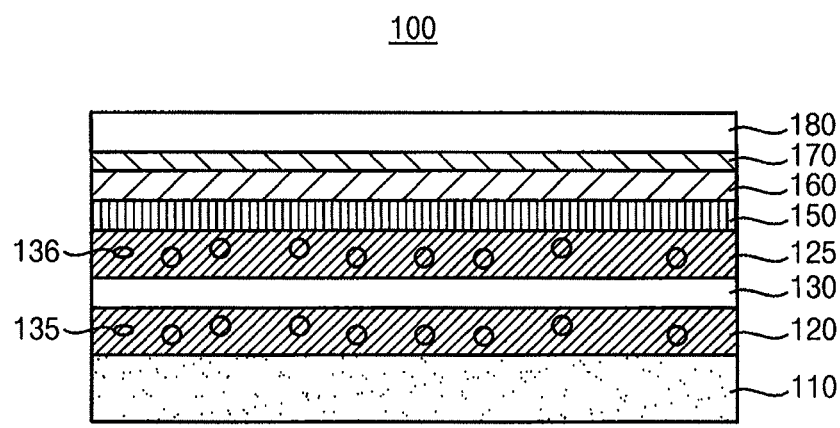

Referring to FIG. 2F, a protection window 180 may be disposed on the oxide layer 170. In example embodiments, the protection window 180 and the PET film 150 including the pattern layer 160 and the oxide layer 170 may be bonded together by an optically clear adhesive (OCA). Further, in example embodiments, the protection window 180 may be a glass window. In other example embodiments, the protection window 180 may be a plastic window. The protection window 180 may be formed on top of the bezel structure 100. Thus, the protection window 180 may protect a lower structure from external shock, moisture transmission, etc. Furthermore, the protection window 180 may be integrally formed on not only the bezel but also display areas in a display device.

Figure 3:
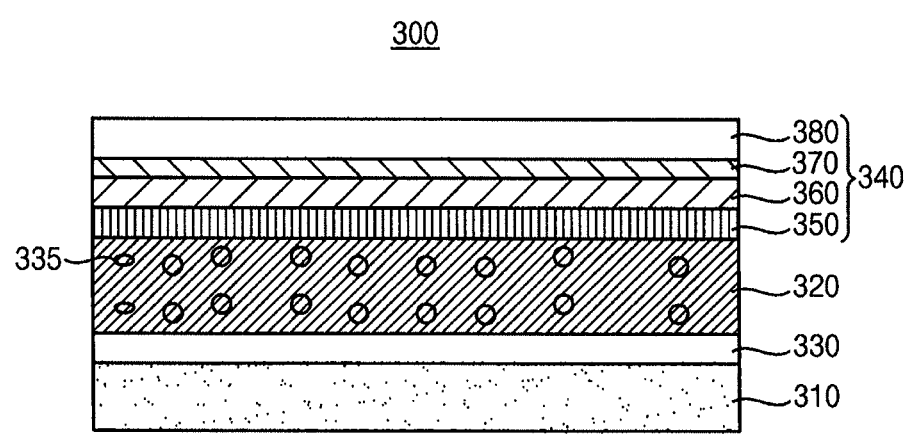
FIG. 3 illustrates a cross-sectional view of a bezel structure for a display device according an exemplary embodiment.

FIG. 3 illustrates a cross-sectional view of a bezel structure for a display device according to example embodiments.

Referring to FIG. 3, the bezel structure 300 for a display device may include a first resin layer 310, an ink layer 320, a second resin layer 330, and an upper structure 340. In example embodiments, the upper structure may include a PET film 350 and a protection window 380. In some example embodiments, the upper structure 340 may further include a pattern layer 360 and an oxide layer 370.

In example embodiments, the upper structure 340 may include a pattern layer 360 including a pattern that is patterned by an ultraviolet (UV) molding process with a polymer resin, and further include an oxide layer 370 formed on the pattern layer 360. The oxide layer 370 may include a plurality of oxides that have respective refractive indexes. The PET film 350 and the protection window 380 may be bonded together by an optically clear adhesive. Further, the protection window 380 may be a glass window or a plastic window.

The second resin layer 330 may be disposed on the first resin layer 310. Thus, the second resin layer 330 may prevent monomers (i.e., an uncured ultraviolet curable resin) from permeating into cavity 335 (or cavities) of the ink layer 320 because the second resin layer 330 is disposed under the ink layer 320. Therefore, the second resin layer 330 may prevent or substantially prevent discoloration of the bezel. In example embodiments, the second resin layer 330 may include a transparent polymer resin.

The ink layer 320 may determine a color of the bezel. The ink layer 320 may include a non-volatile solvent. The ink layer 320 may be formed over the first resin layer 310. The non-volatile solvent may be hard to evaporate in a drying process, so that the cavity 335 generated in the ink layer 320 may be reduced (or, be minimized).

Since certain features are described above, duplicated descriptions will not be repeated.

As described above, the bezel structure 300 for a display device in FIG. 3 may minimize the generation of cavities in a drying process of the ink layer 320 when non-volatile solvents are used to form the ink layer 320. In addition, the bezel structure 300 may prevent monomers from permeating into the cavities 335 of the ink layer 320 when the second resin layer 130 (i.e., the transparent resin layer) is disposed between the first resin layer 310 and the ink layer 320. Therefore, discoloration of the bezel may be prevented or substantially prevented.

Figure 4:
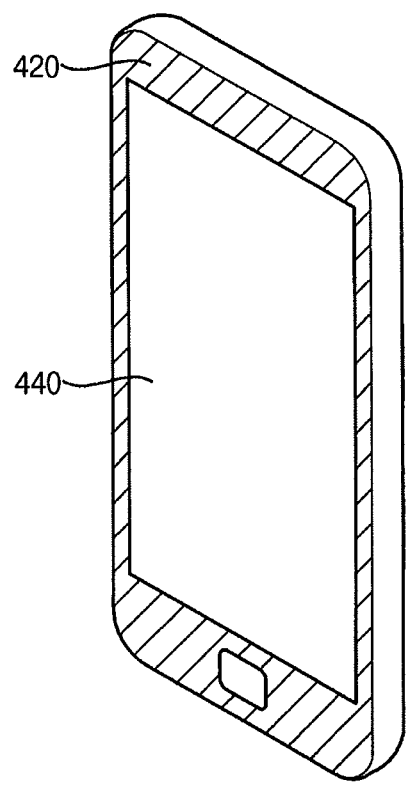
FIG. 4 illustrates a diagram illustrating a display device having a bezel structure according to example embodiments.
Figure 5:
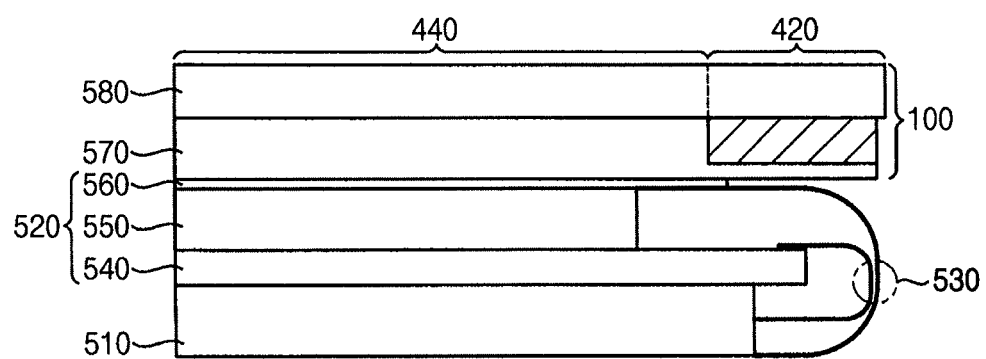
FIG. 5 illustrates a cross-sectional view of the display device of FIG. 4.

FIG. 4 illustrates a diagram illustrating a display device having a bezel structure according to example embodiments. FIG. 5 illustrates a cross-sectional view of the display device of FIG. 4.

Referring to FIG. 4 and FIG. 5, the display device 400 may include a display area 440 and a bezel 420. The display area 440 may display texts, images, videos, etc. The display device 400 may be combined with a touch-input device. The bezel 420 may correspond to an area of the display device 400 not including the display area 440 of the display device 400. The bezel 420 may include a flexible printed circuit board (FPCB) and internal circuits. In example embodiments, a touch input area and a button may be included in the bezel 440. A bezel structure according to example embodiments may prevent or substantially prevent discoloration of the bezel 420.

As illustrated in FIG. 5, the display device 400 may include a display panel 510, a functional panel 520 that may be disposed on the display panel 510, a flexible printed circuit board 530 that may electrically connect the display panel 510 to the functional panel 520, and a bezel structure 100 that may include a transparent resin layer and an ink layer for preventing discoloration of the bezel 420. Further, an ultraviolet curable resin layer (i.e., a first resin layer) 570 may be disposed (or be deposited) on the overall functional panel 520 (or, a lower panel) to bond the functional panel 520 to a protection window 580, and to maintain reliability of the panels 520 and 510.

The display panel 510 may include a plurality of pixel circuits. The display panel 510 may include a scan driving unit, a data driving unit, a power unit, a timing control unit, etc.

In example embodiments, the functional panel 520 may include at least one of a protection film 540, a polarizing plate, and a touch screen panel 560. Since these are examples, the functional panels and locations of the functional panels are not limited thereto. Any panels (or, plates) may be included in the functional panel 520 to provide various functions to the display device 400.

The bezel structure 100 may include a first resin layer 570 that is cured by ultraviolet radiation, an ink layer including non-volatile solvent disposed on the first resin layer 570, a second resin layer disposed in the ink layer, and an upper structure disposed on the ink layer. The second resin layer may prevent an uncured portion of the first resin layer 570 from permeating into a cavity in the ink layer. Further, in example embodiments, the second resin layer may include a transparent polymer resin, and the upper structure may include a PET film and the protection window 580. In some example embodiments, the upper structure may further include a pattern layer and an oxide layer. The bezel structure 100 may prevent discoloration of the bezel 420.

In example embodiments, the bezel structure 100 may include the first resin layer 570, an ink layer including non-volatile solvent disposed on the first resin layer 570, a second resin layer disposed between the first resin layer and the ink layer, and an upper structure disposed on the ink layer. The second resin layer may prevent an uncured portion of the first resin layer 570 from permeating into a cavity in the ink layer. Further, in example embodiments, the second resin layer may include a transparent polymer resin, and the upper structure may include a PET film and the protection window 580. In some example embodiments, the upper structure may further include a pattern layer and an oxide layer. The bezel structure 100 may prevent discoloration of the bezel 420.

As described above, the display device 400 having the bezel structure 100 may prevent or substantially prevent discoloration of the bezel 420 based on the bezel structure. Thus, defects of the display device 400 may be reduced. In addition, the display device 400 may provide an aesthetic effect to users.

The present embodiments may be applied to a display device and an electronic device including the display device. For example, the present embodiments may be applied to a television, a three dimensional (3D) television, a mobile phone, a smart phone, a smart pad, a laptop computer, a tablet computer, a personal digital assistants (PDA), a portable multimedia player (PMP), a digital camera, a music player, a portable game console, a navigation device, etc.

By way of summation and review, bezels may be discolored when an uncured ultraviolet curable resin permeates into cavities that are generated in the ink layer.

In contrast, example embodiments provide a bezel structure for a display device capable of preventing discoloration of a bezel. Therefore, a bezel structure for a display device according to example embodiments may minimize the generation of cavities in a drying process of an ink layer by using non-volatile solvents to form the ink layer. In addition, the bezel structure may prevent monomers (i.e., an uncured resin of an ultraviolet curable resin layer) from permeating into the cavities of the ink layer by disposing a transparent resin layer in an ink layer (or, under the ink layer) that determines a color of the bezel. Therefore, discoloration of the bezel may be prevented.

In addition, a display device having a bezel structure according to example embodiments may prevent discoloration of the bezel based on the bezel structure. Thus, defects of the display device may be reduced. In addition, the display device may provide an aesthetic effect to users.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A bezel structure for a display device, the bezel structure comprising:
    a first resin layer, the first resin layer being curable by ultraviolet radiation;
    a first ink layer on the first resin layer, the first ink layer including a non-volatile solvent;
    a second resin layer on the first ink layer;
    a second ink layer on the second resin layer, the second ink layer including a non-volatile solvent and the second resin layer preventing an uncured portion of the first resin layer from permeating into a cavity in the second ink layer; and
    an upper structure on the second ink layer.

2. The structure as claimed in claim 1, wherein the second resin layer includes a transparent polymer resin.

3. The structure as claimed in claim 1, wherein the upper structure includes a polyethylene-terephthalate (PET) film and a protection window on the PET film.

4. The structure as claimed in claim 3, wherein the upper structure further includes a pattern layer on the PET film, the pattern layer including a pattern that is patterned by an ultraviolet molding process with a polymer resin.

5. The structure as claimed in claim 4, wherein the upper structure further includes an oxide layer on the pattern layer, the oxide layer including a plurality of oxides that have respective refractive indexes.

6. The structure as claimed in claim 3, wherein the PET film and the protection window are bonded by an optically clear adhesive.

7. The structure as claimed in claim 3, wherein the protection window includes a glass window.

8. A bezel structure for a display device, the bezel structure comprising:
    a first resin layer curable by ultraviolet radiation;
    an ink layer over the first resin layer, the ink layer including a non-volatile solvent;
    a second resin layer between the first resin layer and the ink layer, the second resin layer preventing an uncured portion of the first resin layer from permeating into a cavity in the ink layer; and
    an upper structure on the ink layer, the upper structure being on an opposite side of the ink layer from the first resin layer and the second resin layer.

9. The structure as claimed in claim 8, wherein the second resin layer includes a transparent polymer resin.

10. The structure as claimed in claim 8, wherein the upper structure includes a polyethylene-terephthalate (PET) film and a protection window on the PET film.

11. The structure as claimed in claim 10, wherein the upper structure further includes a pattern layer on the PET film, the pattern layer including a pattern that is patterned by an ultraviolet molding process with a polymer resin.

12. The structure as claimed in claim 11, wherein the upper structure further includes an oxide layer on the pattern layer, the oxide layer including a plurality of oxides that have respective refractive indexes.

13. The structure as claimed in claim 10, wherein the PET film and the protection window are bonded by an optically clear adhesive.

14. The structure as claimed in claim 10, wherein the protection window includes a glass window.

15. A display device, comprising:
    a display panel;
    a functional panel on the display panel;
    a flexible printed circuit board (FPCB) in electrical communication with the display panel and the functional panel; and
    a bezel structure, the bezel structure being the bezel structure as claimed in claim 1.

16. The device as claimed in claim 15, wherein the functional panel includes at least one of a protection film, a polarizing plate, and a touch screen panel.

17. The device as claimed in claim 15, wherein the second layer is a transparent layer.

18. The device as claimed in claim 17, wherein the second resin layer includes a transparent polymer resin, and
    wherein the upper structure includes a polyethylene-terephthalate (PET) film and a protection window on the PET film.

19. The display device as claimed in claim 15, wherein:
    the display device includes a display area,
    the first ink layer, the second resin layer, and the second ink layer of the bezel structure bound the display area, and
    the first resin layer and the upper structure of the bezel structure extend into the display area.

* * * * *